United States Patent
Koch et al.

(10) Patent No.: US 11,888,126 B2
(45) Date of Patent: Jan. 30, 2024

(54) METHOD FOR DETECTING A FAULT STATE OF A BATTERY CELL, DETECTION DEVICE, AND MOTOR VEHICLE

(71) Applicant: AUDI AG, Ingolstadt (DE)

(72) Inventors: Sebastian Koch, Ingolstadt (DE); Christian Roettinger, Ingolstadt (DE); Markus Goebel, Nassenfels (DE)

(73) Assignee: AUDI AG, Ingolstadt (DE)

( * ) Notice: Subject to any disclaimer, the term of this patent is extended or adjusted under 35 U.S.C. 154(b) by 48 days.

(21) Appl. No.: 17/721,473

(22) Filed: Apr. 15, 2022

(65) Prior Publication Data

US 2022/0376314 A1 Nov. 24, 2022

(30) Foreign Application Priority Data

May 21, 2021 (DE) .......................... 102021113211.8

(51) Int. Cl.
| | | |
|---|---|---|
| *G01R 31/00* | (2006.01) | |
| *H01M 10/42* | (2006.01) | |
| *B60L 3/00* | (2019.01) | |
| *G01R 31/388* | (2019.01) | |
| *H01M 10/48* | (2006.01) | |
| *G01R 31/396* | (2019.01) | |

(52) U.S. Cl.
CPC ....... *H01M 10/4285* (2013.01); *B60L 3/0046* (2013.01); *G01R 31/388* (2019.01); *G01R 31/396* (2019.01); *H01M 10/482* (2013.01)

(58) Field of Classification Search
USPC .......................... 324/426, 432–435; 320/152
See application file for complete search history.

(56) References Cited

U.S. PATENT DOCUMENTS

| | | | | |
|---|---|---|---|---|
| 2014/0015488 A1* | 1/2014 | Despesse | ............ | H01M 10/441 429/7 |
| 2014/0062415 A1* | 3/2014 | Barsukov | ............ | H02J 7/00041 320/152 |
| 2014/0162159 A1* | 6/2014 | Lebzelter | .......... | H01M 8/04679 429/432 |

FOREIGN PATENT DOCUMENTS

| | | |
|---|---|---|
| DE | 102013205334 A1 | 10/2014 |
| DE | 102020109133 A1 | 10/2020 |
| DE | 102019212426 A1 | 2/2021 |

OTHER PUBLICATIONS

German Examination Report dated Mar. 11, 2022 in corresponding German Patent Application No. 102021113211.8; 22 pages.

* cited by examiner

Primary Examiner — Vincent Q Nguyen

(74) Attorney, Agent, or Firm — Maier & Maier, PLLC

(57) ABSTRACT

A method for detecting a fault state of at least one battery cell of a battery having multiple battery cells. A cell voltage of a respective battery cell of the multiple battery cells is registered at a measurement time and a comparison value is determined as a function of at least one of the cell voltages and is compared to a provided first reference value. The fault state is detected as a function of a result of the comparison. A scatter value is determined, which represents a scatter of at least part of the cell voltages registered at the specific measurement time, and the fault state is determined as a function of the scatter value.

10 Claims, 5 Drawing Sheets

METHOD FOR DETECTING A FAULT STATE OF A BATTERY CELL, DETECTION DEVICE, AND MOTOR VEHICLE

FIELD

The invention relates to a method for detecting a fault state of at least one battery cell of a battery having multiple battery cells, wherein a cell voltage of a respective battery cell of the multiple battery cells is registered at a measurement time and a comparison value is determined as a function of at least one of the cell voltages, which is compared to a provided first reference value, wherein the fault state is detected as a function of a result of the comparison. Furthermore, the invention also relates to a detection device and a motor vehicle having such a detection device.

BACKGROUND

Batteries, in particular motor vehicle batteries, are known from the prior art, which can be designed, for example, as a traction battery and thus as a high-voltage battery. Such high-voltage batteries typically comprise numerous individual battery cells. These cells can in turn be combined into cell modules. In the past, it was assumed that all cells and cell modules were supplied with sufficient quality and could be operated in the vehicle without major mechanical or thermal influences. From various experiments and in vehicle testing, however, the realization has matured that cell defects can also only occur upon operation. Cell defects can be caused, among other things, by contaminants in the cell manufacturing, for example particles inside the cell, during cell module construction, for example damage to the cell from the outside, or due to damage of the underride protection of the motor vehicle, for example upon driving over a bollard and damaging the cell from the outside. It would therefore be desirable to be able to detect a possible cell defect, which is referred to in the present case as a fault state, as early as possible in order to avoid worse consequences, such as a battery fire.

DE 10 2020 109 133 A1 describes a deviation detection system for an energy storage system. The first group of sensors is associated with an energy storage module having one or more energy storage devices, wherein the sensors in the first group generate current measurements representing one or more parameters of the energy storage module. The control circuit is configured to receive the current measurements and to determine a reference value and/or reference variations of a specific parameter related to the energy storage module, based at least in part on the current measurements. The control circuit compares the monitoring values or monitoring fluctuations of the specific parameter based on the current measurements generated by the sensors to the reference value or reference fluctuation of the particular parameter and detects a deviation that is greater than a provided tolerance range. Furthermore, the monitoring of the battery is largely based on temperature measurements. Furthermore, still further parameters such as voltage, power, or amperage and the like can also be taken into consideration. In this case, multiple temperature sensors can be arranged in a respective energy storage module, which are assigned to the respective energy storage devices within the relevant energy storage module. Temperature curves of the respective temperature sensors can be recorded and compared to a reference temperature curve. Such a reference temperature can be limited at the top and bottom by a provided tolerance range. This can be static or it can be dynamic and can vary over time based on operating conditions, age, etc.

A dynamic definition of such tolerance ranges is advantageous, since situation-related fluctuations can be taken into consideration in this way, but there is the problem here of how specifically such a dynamic adjustment can be implemented. With regard to a registered battery temperature, this is also much more easily implementable than, for example, when using cell voltages as monitoring parameters to identify critical cell states or an occurring cell defect. A cell behaves reproducibly depending on environmental conditions, for example dynamic load profiles or inhomogeneous heating. However, there can be different behavior and strong spreads between the cells within a battery. For example, cells can have slightly different capacitances. This has the result that their voltages can drift apart when discharging, for example under load. However, this drift is not yet a reason to assume a cell defect. In addition, the extent of such a spread is related to aging on the one hand and also depends enormously on the operating condition of the battery. A robust diagnosis across all cells can therefore only be interpreted very roughly. In other words, for example, limiting values for a maximum permitted deviation of a cell voltage from a specified reference value, for example, have to be designed to be very large in order to rule out possible incorrect diagnoses and to avoid an unnecessary warning to the driver of a cell defect or battery fire. Under certain circumstances, however, even small deviations in a cell voltage can indicate a cell defect. This means that cell defects, which initially only cause small voltage changes, go unnoticed for a long time.

SUMMARY

The object of the present invention is therefore to provide a method, a detection device, and a motor vehicle which make it possible to detect a fault state of a battery cell as reliably and as early as possible.

This object is achieved by a method, a detection device, and a motor vehicle.

In a method according to the invention for detecting a fault state of at least one battery cell of a battery having multiple battery cells, a cell voltage of a respective battery cell of the multiple battery cells is registered, in particular measured, at a specific measurement time and a comparison value is determined as a function of at least one of the cell voltages, which is compared to a provided first reference value, wherein the fault state is detected as a function of a result of the comparison. In this case, a scatter value is determined, which represents a scatter of at least part of the cell voltages registered at the specific measurement time, and the fault state is determined as a function of the scatter value.

This advantageously allows the scatter of the cell voltages to be taken into account when detecting the fault state. As already described at the beginning, in different operating states of the battery, for example while driving, during charging, or during recuperation, there can be very different voltage spreads of the cell voltages and thus different scatters of these individual cell voltage values, so that, for example, there can be a strong deviation of an individual cell voltage value from a reference value, for example a mean value, but it is not in itself a reason to assume that a fault state exists. By taking into consideration the scatter of the cell voltages, the assessment of whether or not the a fault state of the battery cell exists can now be assessed significantly better and depending on the situation. To give an example, it is conceivable that in a situation in which the cell voltages of the individual battery cells are scattered very strongly around a mean value, significantly larger deviations of the respective cell voltages from, for example, a reference value or mean value are permissible before a fault state is detected. Conversely, in a situation in which the cell voltages have only an extremely small scatter around a mean value, the maximum permissible deviations from such a mean value can be selected to be significantly smaller, so that in this situation even small deviations from the mean value can result in the detection of a fault state. In this way, fault states can advantageously be detected reliably and early in the same way in all possible operating states of a battery. Limiting values for the maximum permissible deviations of the cell voltages can thus be selected adapted to the respective operating situation of the battery. A robust diagnosis across all cells is thus advantageously possible.

Therefore, if a cell defect or fault state is identified, a service warning can still be displayed in a timely manner and a workshop measure can be initiated. A serious cell defect can initially be displayed as an age-related deterioration of the battery variables. It is therefore particularly advantageous that all remaining cells of the battery are also taken into consideration when assessing the presence of a fault state of a cell. If the battery variables deteriorate purely as a result of aging, attempts are often made to counteract the whole thing via balancing, due to which the other cells also age faster. If the battery variables deteriorate based on an actual cell defect, only the affected cell typically displays a change in its battery variables, in particular its cell voltage, in comparison to the other cells, which can now advantageously be registered accurately and early, taking into consideration the scatter related to the situation and operating state. A further advantage of the method described is that, in principle, the registration of the cell voltages at a single measurement time is sufficient to detect a fault state. In other words, a time profile of a cell voltage or of a variable dependent on the cell voltage does not necessarily have to be considered, although this is nevertheless possible.

The determined scatter value can be used, for example, to determine the comparison value and/or the first reference value. For example, the comparison value that is compared to the reference value can be determined as a function of the scatter value. However, it can also be provided that the first reference value is determined as a function of the scatter value.

The battery is preferably a high-voltage battery for a motor vehicle. As also already described at the outset, this can have multiple battery cells, for example lithium-ion cells. These can optionally be combined into battery modules. In the present case, however, the battery can also represent a battery module for such a high-voltage battery of a motor vehicle. Such a high-voltage battery can correspondingly comprise multiple such battery modules. In other words, the method described can be carried out globally for all battery cells comprised by a high-voltage battery or separately for a respective battery module of such a high-voltage battery. In addition, still further battery and cell parameters, in particular in addition to the registered cell voltage, can also be taken into consideration to assess the presence of a cell defect, for example, the temperature in the battery module or in the battery, the installation position, the state of charge, etc.

The cell voltages of the respective battery cells registered at the specific measurement time, and in particular also at other specific measurement times, are registered by measurement and provided in the form of respective voltage values. Accordingly, the term voltage value is sometimes used in the following instead of cell voltage. In other words, the terms cell voltages and voltage values are to be understood hereinafter as synonyms.

In a further advantageous embodiment of the invention, the scatter value is determined for a subgroup of the cell voltages registered at the measurement time, wherein the subgroup does not comprise at least one maximum and/or minimum voltage value of the voltage values registered at the measurement time. In other words, the scatter value is only determined for a part of the registered cell voltages that are in the defined subgroup. The extreme voltage values in particular are excluded from this subgroup. This has the great advantage that the actual scatter of the cell voltages cannot be corrupted by extreme values of defective cells. In other words, defective cells can have a cell voltage that deviates very strongly from the mean value of the other cell voltages. However, if such an extreme cell voltage is taken into consideration both in the averaging and in the determination of the scatter value, this ultimately results in a significantly larger scatter value. Such a negative influence of a voltage value of a defective cell can thus advantageously be avoided. It can be provided that only the maximum voltage value or only a minimum voltage value of all voltage values is excluded from the subgroup. However, it is advantageous if at least the maximum and the minimum voltage value of all voltage values that were registered at the same measurement time are excluded. In addition, not only a maximum voltage value, but also the two, three, or generally n greatest voltage values and m least voltage values can be excluded from the subgroup, wherein n and m are each natural numbers and the sum of n and m is less than the number of battery cells that are comprised by the battery. The sum of n and m is preferably at most half of all battery cells. In addition, it is preferred that n and m are equal. If n and m each represent 25 percent of all battery cells, the maximum scatter of the subgroup especially represents the interquartile range. If at least 50 percent of all registered cell voltages are comprised by the subgroup, a representative scatter value can be determined. Preferably, however, significantly fewer than 50 percent of all cell voltages are excluded from the subgroup, since it cannot be assumed that a cell defect will occur in 50 percent of all cells of the battery at the same time, at least not in normal circumstances in which there is no accident of the motor vehicle.

It is also particularly advantageous if the scatter value is provided as an absolute value of a difference between a maximum and a minimum voltage value of the subgroup. This scatter value thus represents in a certain way the maximum scatter amplitude of the subgroup. The scatter value can thus be determined mathematically in a particularly simple and rapid manner, as a result of which the method described is particularly easy to implement.

In a further very advantageous embodiment of the invention, at least one extreme voltage value, which represents a maximum and/or minimum voltage value of the voltage values registered at the measurement time, is compared to a second reference value, wherein the comparison value represents the scatter value and the fault state is detected, if the scatter value is at most as large as the first reference value and the at least one extreme voltage value deviates from the second reference value by at least one first limiting absolute value; and if the scatter value is greater than the reference value and the at least one extreme voltage value deviates from the second reference value by at least one second limiting absolute value that is greater than the first limiting absolute value.

In other words, if the scatter of the cell voltages within the subgroup is large, larger deviations from the reference value can be permissible for detecting the fault state than if the scatter of the cell voltages within the subgroup is small. For example, if the scatter value determined for the subgroup, as described above, is less than 10 millivolts, for example, a maximum permissible deviation of 20 millivolts from the second reference value can be defined, from which point the fault state is detected. If one of the voltage values thus deviates from the second reference value by more than these 20 millivolts, the fault state is considered to be detected, for example. If the scatter value of the subgroup is greater than the 10 millivolts mentioned, for example, the second limiting absolute value can be, for example, 400 millivolts instead of the above-mentioned 20 millivolts. If, for example, a cell voltage then deviates from the second reference value by more than 400 millivolts, the fault state can also be considered to have been detected. If the deviation is less than 400 millivolts, on the other hand, no fault state is detected in this case. In this way, depending on the scatter value of the subgroup, a value suitable for the respective situation can be defined for the limiting absolute value, which defines a maximum permissible deviation from a reference value, namely the second reference value. In this way, a possible fault state of a battery cell can advantageously be detected reliably and at an early stage in any arbitrary, even dynamic, operating situation.

It is also very advantageous if the second reference value represents a mean value at least of the voltage values comprised by the subgroup. The reference value can also represent a mean value of all voltage values at the stated measurement time. In this case, it is particularly advantageous if the reference value is not provided, or is not provided exclusively, on the basis of a model. This is because a direct comparison is obtained to the behavior of the other battery cells. Aging-related effects can thus advantageously also be taken into consideration, which typically occur in approximately the same way in all cells.

As already mentioned, the method described advantageously makes it possible to detect a fault state in any operating state of the battery. Accordingly, the specific measurement time can be in an operating state of the battery and/or the motor vehicle, which represents, for example, an idle state, for example a switched-off state of the motor vehicle, without the motor vehicle or the battery being charged, or which represents a state of charge of the battery, a discharge state, for example during driving operation of the motor vehicle, wherein different driving states can also be comprised thereby, for example, during acceleration of the vehicle, deceleration of the vehicle, and a recuperation phase.

In a further embodiment of the invention, a standard deviation or a variance for all cell voltages registered at the time of measurement is determined as the scatter value. In this example, therefore, no cell voltage is excluded. As usual, the variance can be defined as the mean square deviation from a mean value, while the standard deviation represents the square root of the variance. Even though, as described above, a possible corruption of such a standard deviation or variance due to possibly defective cells cannot be ruled out, the scatter of the cell voltages in a respective operating state can also be advantageously taken into consideration hereby, as a result of which fault states can be detected more accurately.

However, precisely when the standard deviation or the variance is used as the scatter value, it is advantageous to observe this scatter value not just for a present state, but over time. Accordingly, it represents a further very advantageous embodiment of the invention when the cell voltages are determined for multiple successive measurement times and a respective scatter value is determined for the respective measurement times, wherein the fault state is detected as a function of a time profile of the scatter values, in particular wherein a change over time of the scatter value is determined as the comparison variable and the fault state is considered to be detected when the comparison variable exceeds the first reference value.

In this way, it can advantageously be detected when, for example, the standard deviation or variance changes abruptly in the course of time. Such an abrupt change very strongly indicates a possible fault state of a battery cell, which can thus also be reliably detected.

It is also very advantageous if the multiple consecutive measurement times are in an operating time window which is associated with a specific operating state of the battery in which a change over time of a battery current of the battery is less than a predetermined or predeterminable limiting value. In other words, it is advantageous in this case, i.e., if the variance or standard deviation is used as the scatter value, if the cell voltages are measured in an operating state of the battery which does not have any dynamic ranges, but in which the battery current is at least approximately constant or even zero. This can be the case, for example, when the motor vehicle is stationary or in the idle state of the battery or, for example, during a charging state for charging the battery, in particular with a constant charging current or charging current that changes only slowly or at least not abruptly over time. Even if the motor vehicle is, for example, presently in driving operation at a red traffic signal and an at least approximately constant discharge current is therefore drawn from the battery for supplying electrical consumers of the motor vehicle during this phase, this can represent such a suitable operating state. Significant changes in the scatter value caused by dynamic conditions, as they exist, for example, when driving, accelerating, or recuperating, can thus be excluded.

Furthermore, the invention also relates to a detection device for detecting a fault state of at least one battery cell of a battery having multiple battery cells, wherein the detection device is designed to register a cell voltage of a respective battery cell of the multiple battery cells at a specific measurement time, to determine a comparison value as a function of at least one of the cell voltages, to compare the comparison value to a first reference value that is provided, and to detect the fault state as a function of a result of the comparison. The detection device is designed to determine a scatter value ($\Delta U_n$), which represents a scatter of at least a part of the cell voltages registered at the specific measurement time, and to determine the fault state as a function of the scatter value.

The advantages described for the method according to the invention and its embodiments apply in the same way to the detection device according to the invention.

Furthermore, the invention also relates to a motor vehicle having a detection device according to the invention or one of its designs.

The invention also includes embodiments of the detection device according to the invention, which have features as have already been described in conjunction with the embodiments of the method according to the invention. For this reason, the corresponding embodiments of the detection device according to the invention are not described again here.

The motor vehicle according to the invention is preferably designed as an automobile, in particular as a passenger car or truck, or as a passenger bus or motorcycle.

The invention also comprises combinations of the features of the described embodiments. The invention also includes implementations that each have a combination of the features of several of the described embodiments, provided that the embodiments were not described as mutually exclusive.

BRIEF DESCRIPTION OF THE FIGURES

Exemplary embodiments of the invention are described hereinafter. In the figures.

DETAILED DESCRIPTION

The exemplary embodiments explained hereinafter are preferred embodiments of the invention. In the exemplary embodiments, the described components of the embodiments each represent individual features of the invention to be considered independently of one another, which each also refine the invention independently of one another. Therefore, the disclosure is also intended to comprise combinations of the features of the embodiments other than those illustrated. Furthermore, the described embodiments can also be supplemented by further ones of the above-described features of the invention.

In the figures, the same reference signs designate elements that have the same function.

Figure 1:
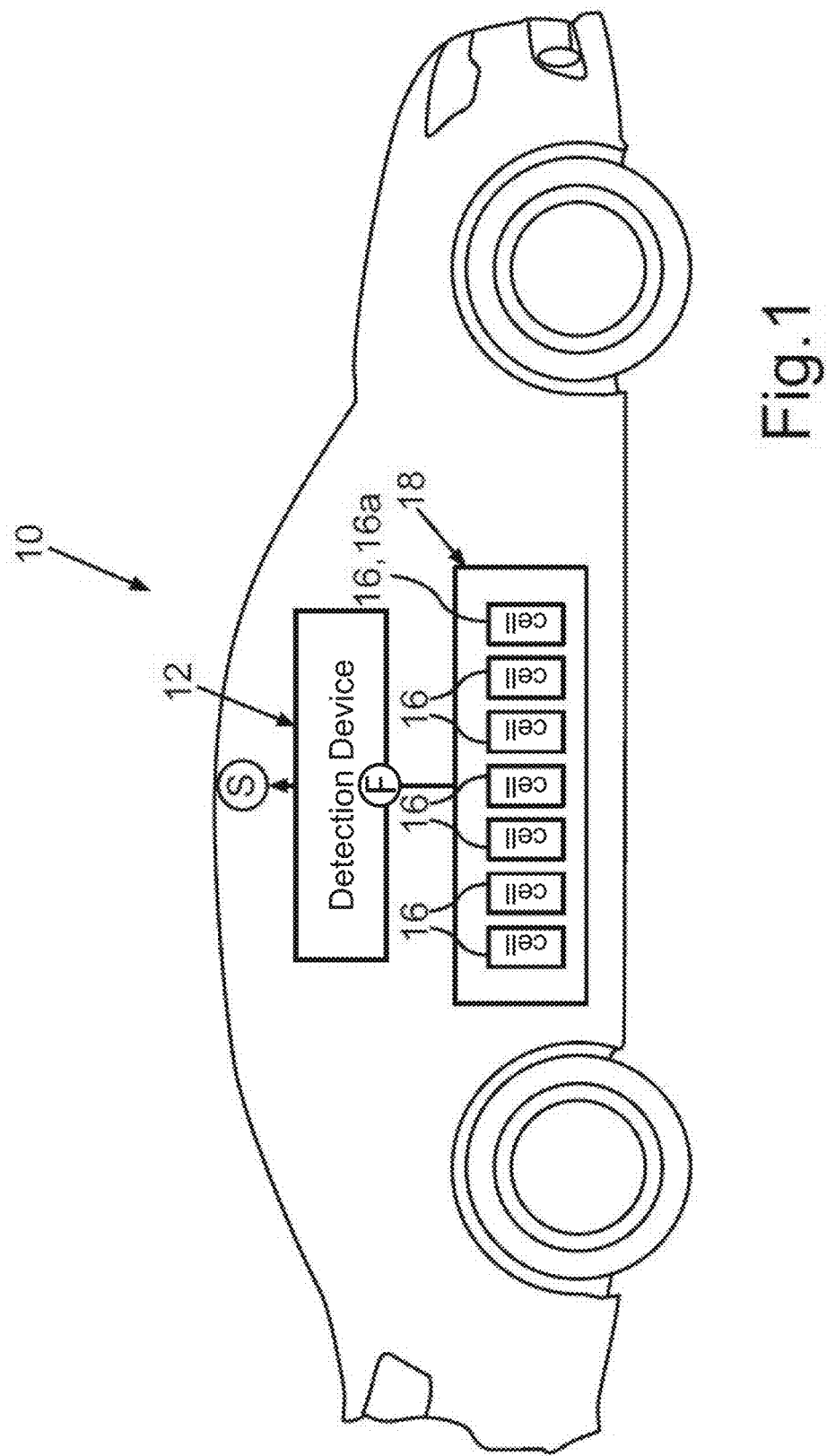
FIG. 1 shows a schematic representation of a motor vehicle having a detection device for detecting a fault state of a battery cell according to an exemplary embodiment of the invention.

FIG. 1 shows a schematic representation of a motor vehicle 10 having a detection device 12 for detecting a fault state F of a battery cell 16 of a battery 18 of the motor vehicle according to an exemplary embodiment of the invention. The battery 18 can be designed as a high-voltage battery of the motor vehicle 10 or as a battery module of such a high-voltage battery. The battery 18 furthermore comprises multiple battery cells 16. One of these battery cells 16 is additionally denoted by 16a in order to be able to better illustrate and describe the method for detecting a fault state F of such a battery cell 16. Correspondingly, the procedure for how a fault state of such a battery cell 16 can be detected is explained on the basis of this first battery cell 16a, but can also be used in the same way for all other battery cells 16. If a fault state F of such a battery cell 16 is detected by the detection device 12, a signal S can be output, such as a warning signal to a driver of the motor vehicle or a signal to initiate a specific measure, such as switching off the battery, the battery cell, or the like.

A cell 16 behaves reproducibly depending on environmental conditions, for example dynamic load profiles, inhomogeneous heating, etc. However, there can be different behavior and strong spread between the cells 16 within a battery 18. As a rule, a robust diagnosis across all cells 16 is therefore sometimes very difficult. Different voltage spreads of the individual cell voltages of the battery cells 16 are to be illustrated below in different situations on the basis of several examples.

Figure 2:
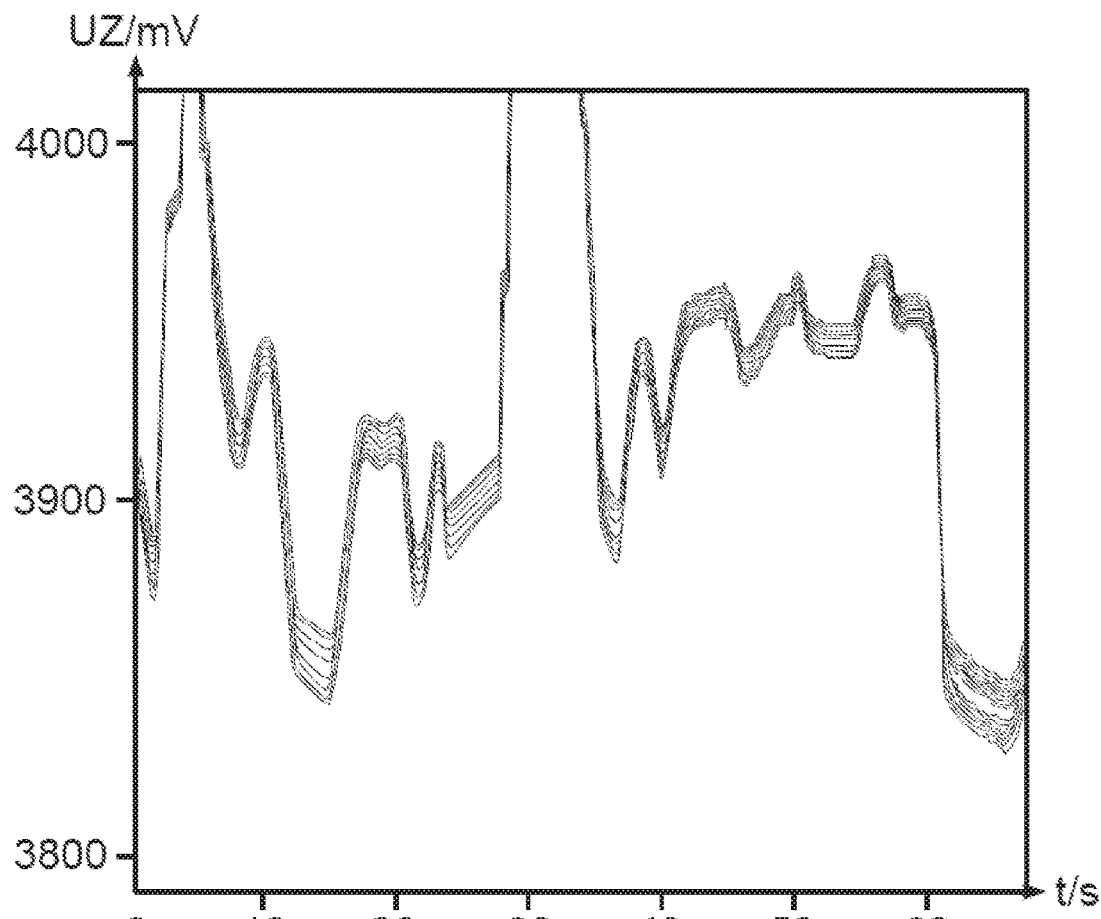
FIG. 2 shows a graphical representation of the voltage curves of the cell voltages of intact battery cells with a large voltage spread in all cells.

FIG. 2 shows, for example, the voltage curves of individual cell voltages UZ plotted over time t in seconds, in particular over a time period of approximately one minute. In this example, none of the cells 16 whose voltage curves are shown in FIG. 2 have a defect. As can be seen, even in the case of non-defective cells 16, there are sometimes very large voltage spreads in all cells 16, depending on the operating state. There are therefore no outliers in this example. As can also be clearly seen in FIG. 2, there are regions in which the individual cell voltage curves are very far apart, but in other regions they in turn quasi-run into one another. Especially when the individual cell voltages UZ are subject to a strong change over time, the corresponding spreads can only be resolved very poorly. This complicates the detection of possible cell defects.

Figure 3:
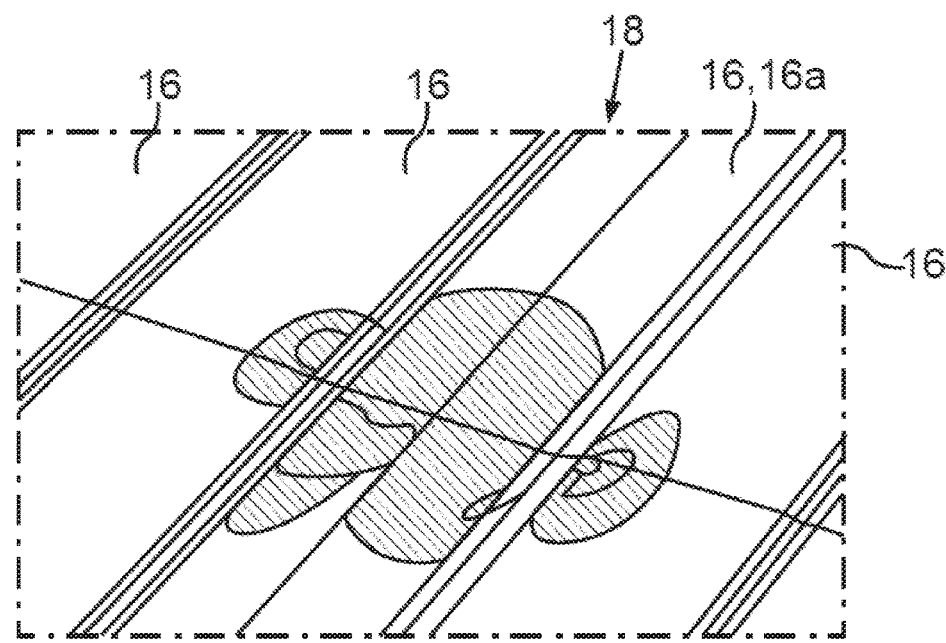
FIG. 3 shows a schematic representation of a mechanically damaged battery cell of a battery.

FIG. 3 shows a schematic representation of a part of a battery 18 having a battery cell 16, which is again denoted as 16a in the present case and is intended to represent a defective battery cell 16a accordingly. In this example, the battery cell 16a is mechanically damaged from the outside and in particular has previous damage in the form of an intrusion of up to 3.4 millimeters. Such mechanical damage to the cell from the outside can results in a cell defect, which is accordingly noticeable in a changed cell voltage UZ. This is illustrated in FIG. 4.

Figure 4:
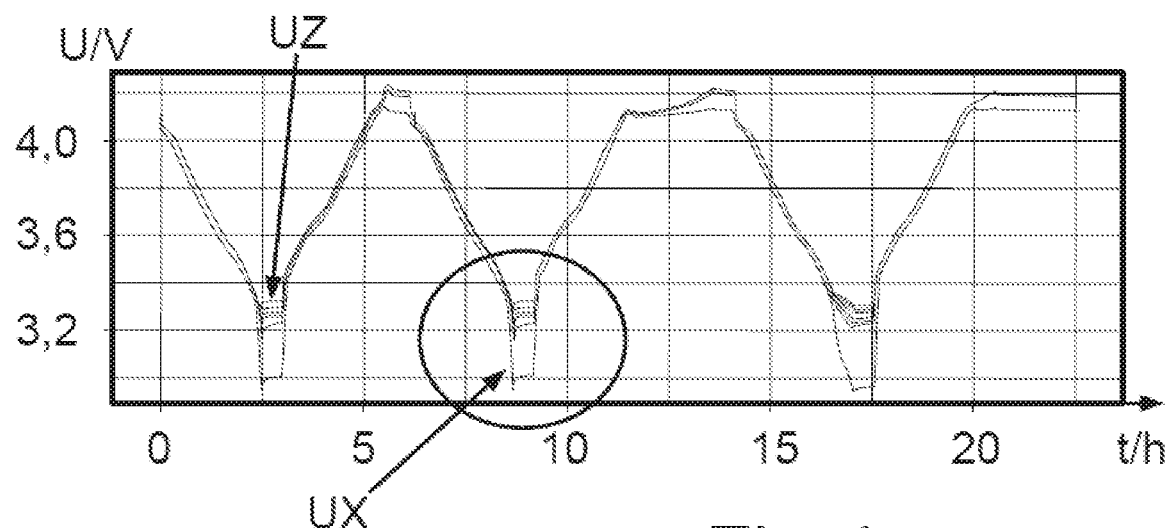
FIG. 4 shows a graphical representation of the voltage curves of the mechanically damaged battery cell from FIG. 3 in comparison to the voltage curves of the other battery cells.

FIG. 4 shows a graphical representation of the voltage curves UZ of the individual cell voltages of the battery 18 from FIG. 3, wherein the voltage curve of the damaged cell 16a is denoted by UX. The time t is plotted here in hours. The battery 18 having the damaged cell 16a is subjected to multiple charging and discharging cycles here, wherein the cell defect of the cell 16a becomes noticeable especially when changing from discharging to charging, in particular in a strongly deviating cell voltage UX. Here again it can be seen that the resulting deviation of this cell voltage UX from the other cell voltages UZ in other regions, for example during charging or discharging, is significantly less pronounced. From this it is already evident that it is difficult, for example, to define a limiting value by means of which such a fault state of a cell 16a can be detected and which is valid for all possible operating ranges of a battery 18 at the same time.

Figure 5:
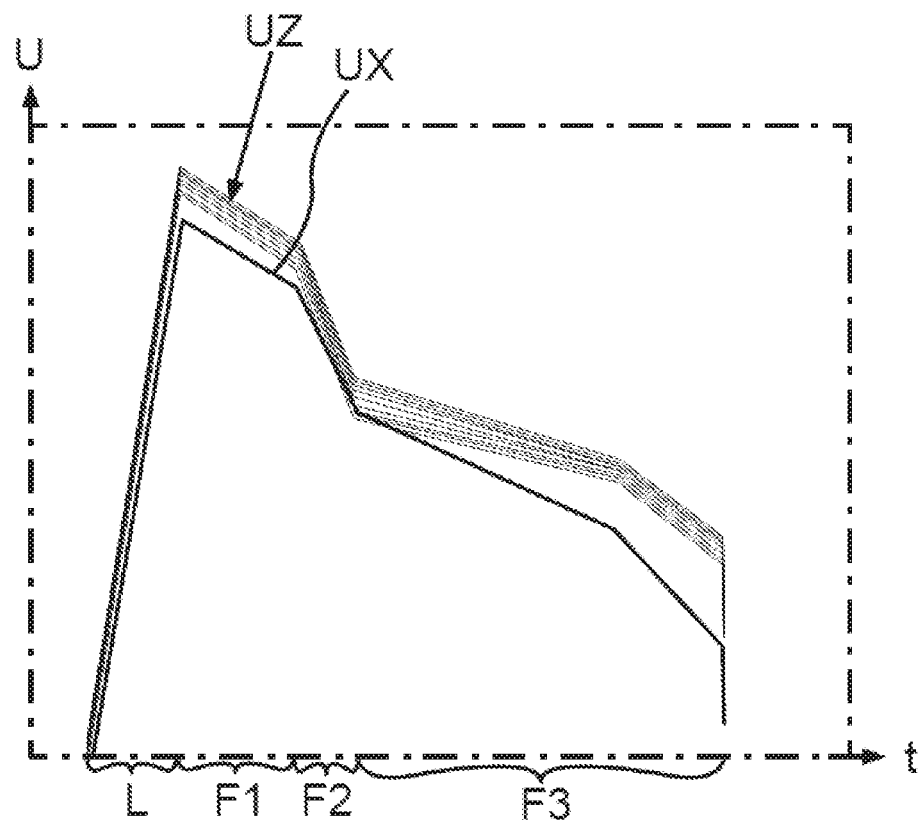
FIG. 5 shows a graphical representation of the voltage curves of multiple battery cells in comparison to a voltage curve of a defective battery cell.

Another example is shown in FIG. 5. The curves of the cell voltages UZ of multiple intact battery cells 16 and of the cell voltage UX of a defective battery cell are also again shown here. A charging process begins in a first time phase.

This loading phase is denoted by L. Moreover, this charging phase L is followed by three driving modes F1, F2, F3 having different loads. At the start of the charging process L, the voltage curves of all cells are still without any voltage deviation from one another. Only at the end of charging, i.e., at the end of the charging phase L, does a first voltage deviation of a cell 16a from the other cells 16 appear. The voltage of this defective cell 16a is again denoted by UX, and the voltage curves of the other cells are denoted by UZ. There is a small standard deviation overall in the region of this first driving mode F1. During the charging L, all cell voltages UX, UZ are therefore still close together. At the end of charging or before the driving mode F1, a cell 16a is then suddenly significantly worse. This is particularly noticeable because the other cells differ from each other by only 10 millivolts, for example. Under load, that is to say in the driving mode state F2, a greater voltage spread can be observed in all cells 16, 16a, but this is not unusual in cells 16 that are cold or heated to an unequal extent. At low load, for example in the driving state range F3, the cell voltages UZ approach each other again, wherein the cell 16a also deviates still further here with its cell voltage UX. As can be seen, the cell defect in cell 16a cannot be recognized equally well in all operating states. For example, no significant deviation of the defective cell 16a from the cell voltages UZ of the other cells 16 can be recognized in the driving range state F2. In principle, however, detection in the driving ranges F1 and F3 is possible. This knowledge is used to define suitable limiting values for detecting such a defective cell 16a, as will be explained in more detail later.

Figure 6:
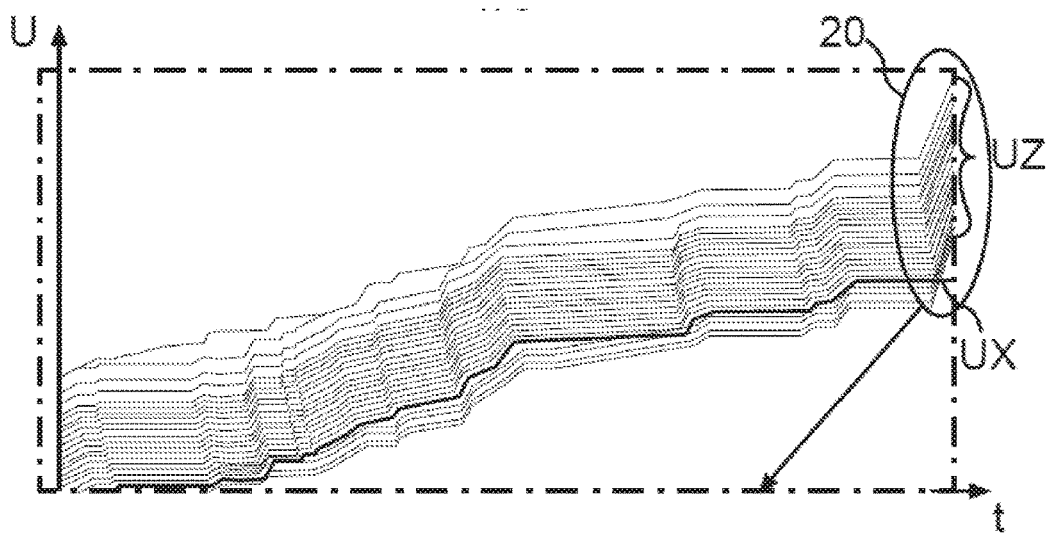
FIG. 6 shows a schematic representation of multiple voltage curves of battery cells including a defective battery cell during a balancing process.
Figure 7:
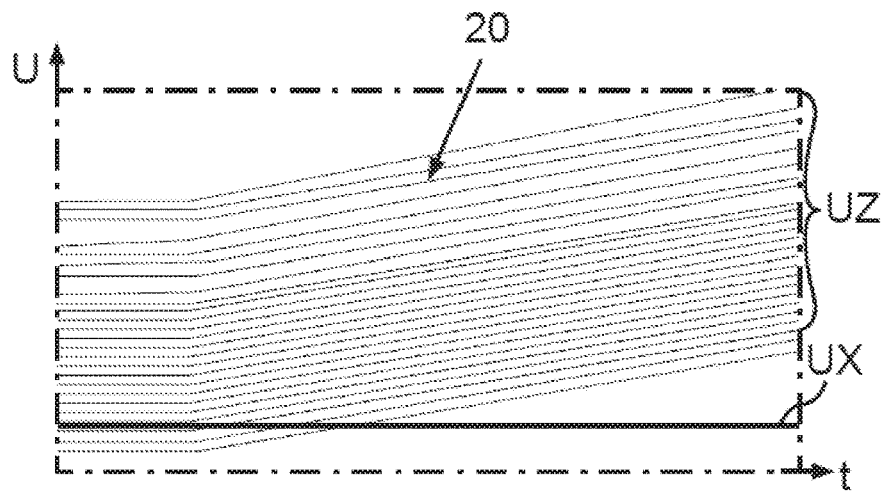
FIG. 7 shows a schematic representation of the end of the balancing process from FIG. 6.
Figure 8:
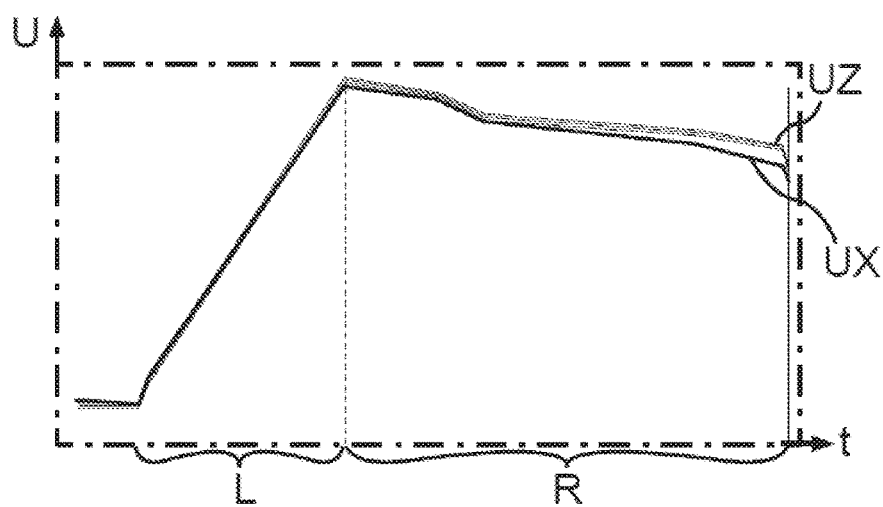
FIG. 8 shows a schematic representation of the voltage curves of battery cells during a charging process with a subsequent idle phase, including the voltage curve of a defective battery cell.

Firstly, FIGS. 6, 7, and 8 each show further examples of voltage curves of individual battery cells 16, including the voltage curve UX of a defective battery cell. FIG. 7 also shows a detail view of a detail from FIG. 6, wherein this detail is denoted by 20. FIG. 6 also shows cell balancing, wherein the balancing times run up together and initially nothing unusual occurs until the last charging process of the cells, which is again illustrated in detail in FIG. 7. It can be seen that the balancing system attempts to balance all cells 16, wherein the cell 16a deviates significantly from the last charging process with its voltage UX from the other voltages UZ and can no longer be charged.

FIG. 8 illustrates a charging process L with a subsequent idle phase R, in which the battery 18 is no longer under load. The idle phase R lasts approximately 30 hours. In this idle phase R, the cell 16a displays an increased self-discharge rate in comparison to the other cells 16 from the last charging process onwards.

In order to be able to detect these defects accurately and at an early stage, there are now multiple options. For this purpose, on the one hand, the battery variables, such as temperature and voltage UZ, UX, and variables derived therefrom, such as the standard deviation and/or an interval range or interquartile range, can be measured or calculated and stored.

For example, the battery variables can be compared to earlier values via the standard deviation under constant, comparable conditions, for example a new charging process with the same charging current, when the vehicle has started with a low discharge current, optionally also taking into consideration the state of charge or battery temperature. If a cell suddenly deviates significantly from the other cells in comparison to the time of the last diagnosis, taking into consideration the standard deviation, it can be assumed that a cell defect has occurred.

It is particularly advantageous above all to use the interquartile range or, in general, an interval range of cell voltages UZ of a specific measurement subgroup in order to determine constant conditions, for example a charging process with constant current, stationary vehicle with low discharge current, where it is possible to compare the battery variations and resulting deviations will be rather small. Under constant conditions and thus, for example, a small interquartile range or a small standard deviation, a small outlier can already indicate a cell defect. For dynamic conditions, on the other hand, the threshold can be applied significantly larger. This allows a possible cell defect to be detected in the same way for different conditions and states.

Figure 9:
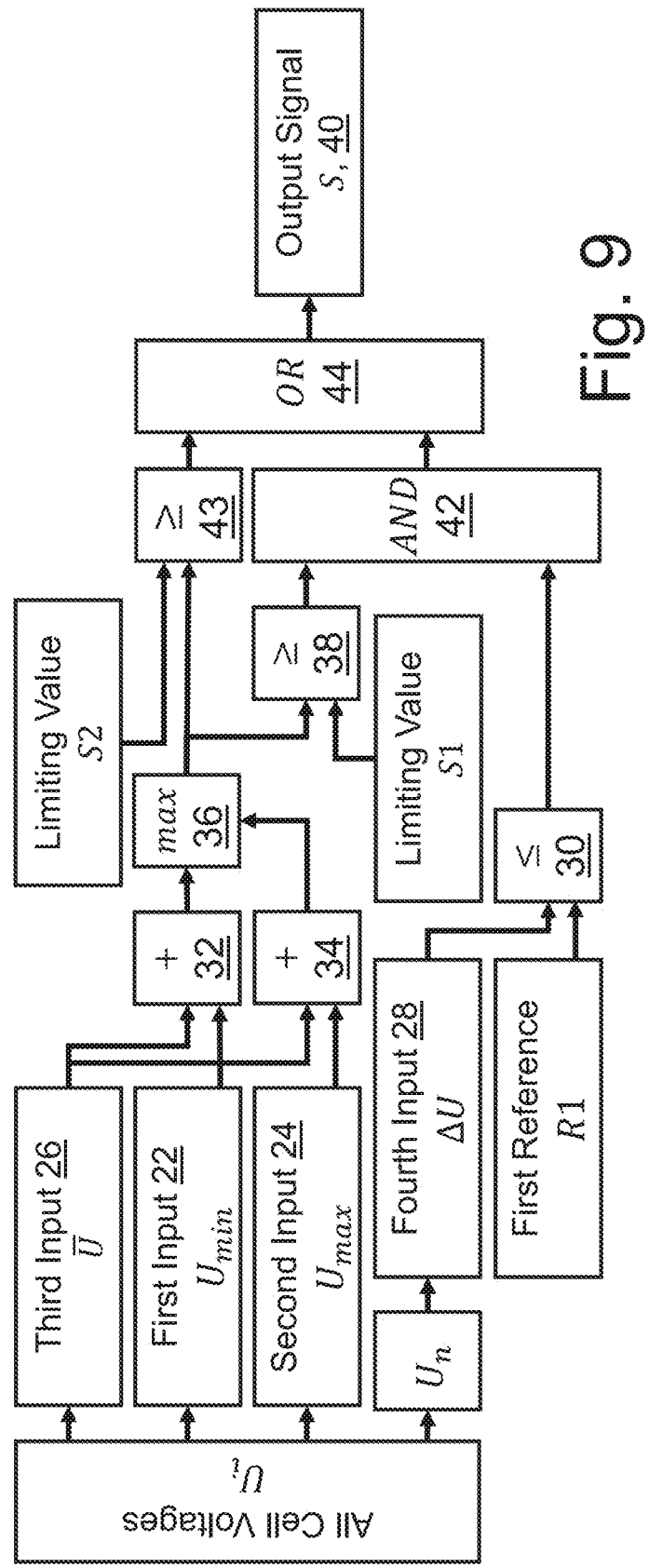
FIG. 9 shows a schematic representation of a detection device for detecting a fault state according to an exemplary embodiment of the invention.

FIG. 9 shows a schematic representation of an embodiment of a detection device of a motor vehicle 10, as can be used for detecting such a cell defect F, for example. As an input variable, the detection device 12 uses the individual cell voltages Ui of all battery cells 16 of the battery 18, including the battery cell 16a initially assumed to be defective. In the present example, a distinction is also no longer made between the cell voltage assigned to a defective battery cell and the other cell voltages, but the method is described in general for all cell voltages Ui of the battery 18. In this case, a minimum cell voltage Umin of all cell voltages Ui is provided at the first input 22 and a maximum cell voltage Umax is provided at a second input 24. Furthermore, a mean value $\overline{U}$ is determined from all cell voltages Ui, which is also referred to as the second reference value $\overline{U}$ within the scope of the present invention, and is provided at a third input 26. Furthermore, a subgroup Un is determined from the cell voltages Ui. At least the maximum and minimum cell voltage Umax, Umin are excluded to determine this subgroup. However, several of the largest and smallest voltage values can also be excluded from this subgroup Un. Furthermore, in this fourth input module 28, the absolute value between a maximum deviation of the greatest and least cell voltage of this subgroup Un is determined. In this case, this distance represents a magnitude of the scatter of this subgroup Un and is therefore referred to hereinafter as the scatter value ΔUn. In a special case, this scatter value can especially represent the interquartile range. This scatter value ΔUn is compared by means of a relational operator 30 to a predefined limiting value, which is also referred to hereinafter as the first reference value R1. In parallel thereto, the respective addition operators 32, 34 are used to determine the absolute value distance between the least voltage value Umin and the mean value $\overline{U}$, on the one hand, and also the absolute value distance between the greatest voltage value Umax and the mean value $\overline{U}$. The largest of these two resulting distances is selected using the maximum operator 36. As a result, this thus supplies the largest voltage difference to the mean value $\overline{U}$ among all input voltages Ui. If the comparison by the comparison operator 30 shows that the scatter value ΔUn is less than or equal to the first reference value R1, then the maximum deviation Δmax described above at the output of the maximum operator 36 is compared to a first threshold value S1. This comparison is in turn performed by a relational operator 38. If this limiting value S1, for example 20 millivolts, is exceeded, an error is detected and a corresponding signal is output at the output 40. Moreover, 42 denotes a logical AND operator, which ensures that both conditions have to be met for this purpose, namely that the maximum deviation Δmax exceeds the first threshold value S1 and the interquartile range or scatter value ΔUn is less than or equal to the first reference value R1. If it is not, then the exceeding of the first limit value S1 by the deviation Δmax also does not result in an error detection. In any case, however, this maximum deviation Δmax is also compared to a second threshold value S2. This second threshold value S2 thus represents a limiting value S2 by which the extreme voltage value, i.e., the least voltage value Umin or the greatest voltage value Umax, may deviate at most from the voltage mean value $\overline{U}$, i.e., the second reference value $\overline{U}$, or in the present example in particular can no longer deviate, so that no fault state F is detected. This comparison is again performed by a further comparison operator 43. The threshold value S2 is significantly greater than the threshold value S1 and is, for example, 400 millivolts. If the deviation Δmax is greater than this second threshold value S2, then a signal S is also output at the output 40, which indicates that an error is present. In this case, 44 represents a logical OR operator.

With a small scatter, which is represented by the scatter value ΔUn, even a small deviation from the mean value $\overline{U}$ can advantageously trigger a signal S, while with large scatters ΔUn, only a large deviation of a voltage value Ui from the mean value $\overline{U}$ results in the output of a such signal S. This makes it possible to select significantly smaller limiting values, for example at 20 millivolts, for the triggering in regions having constant conditions and thus small interquartile ranges, since in such regions even small triggers indicate a cell defect. For dynamic conditions, for example, when driving or recuperating, the threshold is applied much higher, for example at the 400 millivolts described. As a result, a detection of a cell defect can be provided which is adapted to the situation and is nonetheless always early.

Overall, the examples show how the invention can be used to identify a suddenly occurring cell defect in a particularly efficient and adapted manner.

The invention claimed is:

1. A method for detecting a fault state of at least one of a plurality of battery cells of a battery, the method comprising:
   registering, by a detection device and for each of the plurality of battery cells, a cell voltage of a respective battery cell at a specific measurement timepoint,
   determining, for each of the plurality of battery cells, a comparison value of the cell voltage relative to a first reference value, and
   determining a scatter value, the scatter value representing a scatter of at least part of the plurality of cell voltages,
   wherein the fault state is identified based on the plurality of comparison values and/or based on the scatter value.

2. The method as claimed in claim 1, wherein the scatter value is determined for a subgroup of the plurality of cell voltages, and
   wherein at least one of a minimum voltage of the plurality of cell voltages a maximum voltage of the plurality of cell voltages is excluded from the subgroup of the plurality of cell voltages.

3. The method as claimed in claim 1, wherein the scatter value is determined based on an absolute difference between a minimum voltage of the subgroup and a maximum voltage of the subgroup.

4. The method as claimed in claim 1, wherein the method further comprises comparing at least one extreme voltage value, representing a maximum and/or minimum voltage value of the plurality of cell voltages relative to a second reference value,
   wherein, in a case in which the scatter value is less than or equal to the first reference value, the fault state is detected if the at least one extreme voltage value exceeds a first predetermined limiting value,
   wherein, in a case in which the scatter value is greater than the first reference value, the fault state is detected if the at least one extreme voltage value exceeds a second predetermined limiting value, and
   wherein the second predetermined limiting value is greater than the first predetermined limiting value.

5. The method as claimed in claim 1, wherein the second reference value is a mean voltage value of the subgroup.

6. The method as claimed in claim 1, wherein the scatter value is a standard deviation or a variance of the plurality of cell voltages.

7. The method as claimed in claim 1, wherein the method further comprises determining, for each of the plurality of battery cells, successive cell voltages of the respective battery cell at successive measurement times,
   wherein the scatter value is determined for each successive measurement time, and
   wherein the fault state is identified based on a change over time of the scatter value.

8. The method as claimed in claim 7, wherein the successive measurement times are constrained to an operating time window which corresponds to a specific operating state of the battery during which a change over time of a current of the battery is less than a predetermined limiting value.

9. A detection device for detecting a fault state of at least one of a plurality of battery cells of a battery, wherein the detection device is configured to:
   register, for each of the plurality of battery cells, a cell voltage of a respective battery cell at a specific measurement timepoint,
   determine, for each of the plurality of battery cells, a comparison value of the cell voltage relative to a first reference value, and
   determine a scatter value, the scatter value representing a scatter of at least part of the plurality of cell voltages,
   wherein the fault state is identified based on the plurality of comparison values and/or based on the scatter value.

10. A motor vehicle comprising the detection device according to claim 9.

* * * * *